United States Patent [19]
Nakasuji

[11] Patent Number: 5,994,708
[45] Date of Patent: *Nov. 30, 1999

[54] DEMAGNIFYING CHARGED-PARTICLE LITHOGRAPHY APPARATUS

[75] Inventor: Mamoru Nakasuji, Yokohama, Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/936,139

[22] Filed: Sep. 24, 1997

[30] Foreign Application Priority Data

Sep. 25, 1996 [JP] Japan ................................ 8-253104

[51] Int. Cl.⁶ .................................................. H01J 37/317
[52] U.S. Cl. ...................................... 250/492.23; 250/398
[58] Field of Search ........................ 250/492.22, 492.23, 250/492.2, 398, 396 R

[56] References Cited

U.S. PATENT DOCUMENTS 5,747,819 5/1998 Nakasuji et al. .................... 250/492.23

OTHER PUBLICATIONS

"Variable Axis Lens for Electron Beams," Pfeiffer, et al., *Appl. Phys. Lett.* 39(9), Nov. 1981, pp. 775–776.

"Recent Advances wit the Variable Axis Immersion Lens," Sturans, et al., *J. Vac. Sci. Technol.* B 6 (6), Nov./Dec. 1988, pp. 1995–1998.

Nakasuji et al., "Electron Optical Column for High–Speed Electron Beam Delineator: VL–R2," *J. Vac. Sci. Technol.* 21:872–878 (1982).

*Primary Examiner*—Kiet T. Nguyen
*Attorney, Agent, or Firm*—Klarquist Sparkman Campbell Leigh & Whinston, LLP

[57] ABSTRACT

Charged-particle beam lithography apparatus are disclosed that form a demagnified image of a sub-field of a reticle on a sensitized substrate. The charged-particle beam is shaped by a field stop and the field stop is demagnified onto the reticle. A blanking deflector is provided that deflects the charged-particle beam. If the charged-particle beam is sufficiently deflected by the blanking deflector, a blanking aperture blocks the charged-particle-beam while maintaining uniform irradiation of the field stop. After transmission by the reticle, projection lenses project the charged-particle beam onto a sensitized substrate. The charged-particle beam is converging at the field stop so that scattering of the beam and heating of the field stop are reduced.

20 Claims, 3 Drawing Sheets

DEMAGNIFYING CHARGED-PARTICLE LITHOGRAPHY APPARATUS

FIELD OF THE INVENTION

The invention pertains to charged-particle beam lithography apparatus that irradiate and project a demagnified image of a pattern defined on a sub-field of a reticle onto a corresponding location on a sensitized substrate. In particular, an improved irradiation system is provided.

BACKGROUND OF THE INVENTION

In charged-particle-beam (CPB) lithography using an electron-beam, an electron beam emitted by an electron gun is collimated with a condenser lens and then deflected by a deflector to irradiate a selected sub-field of a reticle. The selected sub-field defines a pattern to be projected and transferred to a corresponding location on a sensitized substrate. The substrate is typically a semiconductor wafer that has been coated with a resist sensitive to the electrons. The electron beam is shaped by a field stop before irradiating the reticle so that only the selected sub-field is irradiated. Because the edge of the field stop scatters or reflects a portion of the electron beam, electrons are also incident on unselected locations of the reticle. These electrons generally reach the sensitized substrate, reducing the contrast of the projected images and improperly exposing unselected regions of the sensitized substrate. To reduce scattering from the edge of the field stop, conventional apparatus use field stops that have edges tapered or thinned to resemble knife-edges.

In a conventional apparatus, a condenser lens is placed between the reticle and the electron gun and a projection lens is placed downstream of the reticle. The condenser lens and the projection lens are generally similar lenses. As a result, the distance between the condenser lens and the reticle is large, causing the image of the field stop projected on the reticle to be a magnified (enlarged) image.

Such an apparatus has several disadvantages. In systems in which the field stop is magnified onto the reticle, the current density of the electron beam is larger at the field stop than at the reticle. Because the edge of the field stop is tapered or thinned to reduce scattering, the combination of a high current density and a high beam-acceleration voltage heat the field stop edge sufficiently to melt it.

If a single condenser lens is used between the field stop and the reticle, then the image of the field stop on the reticle varies as the image of the field stop is directed to various reticle sub-fields. In some cases, the magnification of the image of the field stop on the reticle changes if the numerical aperture of the electron beam changes. In such cases, the size of the field stop must be changed whenever the magnification is changed so that the image of the field stop remains a constant size.

When sequentially irradiating sub-fields of the reticle, the electron beam is blocked ("blanked") by a blanking aperture as the beam is directed to the next sub-field. In a conventional apparatus, the irradiation of the sub-fields does not remain uniform as the electron beam is in a transition to a blanked condition, even if the irradiation by the unblanked beam is uniform. In addition, the irradiation of sub-fields that are not situated along the optical axis ("off-axis") is non-uniform because of distortion in the image of the field stop.

SUMMARY OF THE INVENTION

The present invention provides demagnifying charged-particle-beam (CPB) lithography apparatus with improved irradiation of a reticle. A CPB lithography apparatus according to the invention preferably comprises first and second condenser lenses, a charged-particle gun or other suitable source that emits charged particles, and a field stop. The first condenser lens receives charged particles from the source and forms a first crossover; the second condenser re-images the first crossover at a second crossover. A third condenser lens receives the beam from the second crossover and images, with demagnification, the field stop onto a sub-field of the reticle.

A heat sink is preferably provided between the reticle and the field stop. The second condenser lens preferably converges the charged-particle beam to form the second crossover and the field stop is preferably located in this beam. As a result, charged particles directed toward the edge of the field stop are intercepted by the heat sink instead of the field stop, and heating of the field stop by the beam is reduced. Because the beam does not hit the side wall of the field stop, this edge need not be tapered or thinned to reduce scattering or reflection. The thermal mass of the edge of the field stop can thus be higher than the thermal mass of a conventional, tapered field stop, further limiting the temperature rise of the field stop.

In a conventional apparatus, charged particles that are scattered or reflected by the edge of the field stop reduce image contrast. In apparatus according to the present invention, the beam does not strike the side wall of the field stop and improved images are projected onto the sensitized substrate. The aperture of the field stop is preferably defined by a rectangular through-bore in the field stop. The edge of this bore is square and untapered.

The apparatus preferably further comprises a blanking deflector and a blanking aperture. The blanking deflector is preferably located near the second condenser lens and the blanking aperture is centered about the second crossover. The blanking aperture deflects the beam and the blanking aperture blocks the deflected beam if the deflection is sufficiently large. The irradiation of the reticle decreases as the blanking deflector deflects the beam; but, during deflection transitions, the field stop continues to be uniformly irradiated.

The first and second condensers form the second crossover at the axial position of the blanking aperture, so that the numerical aperture of the beam on the sensitized substrate is readily altered by changing the axial position of the second crossover. The blanking deflector is preferably located near to and gun-side of the field stop.

First and second projection lenses are provided that project an image of the sub-field onto the sensitized substrate. A crossover aperture is preferably provided between the first and second projection lenses; the first projection lens forms a third crossover on the axis at the center of the crossover aperture. The second crossover moves toward the optical axis to vary the numerical aperture of the beam at the sensitized substrate.

The apparatus preferably further comprises a first electromagnetic deflector, located on the axis at the blanking aperture, and a second electromagnetic deflector. These deflectors satisfy variable-axis lens (VAL) conditions so that, by using these deflectors together, the image of the field stop projected onto the reticle is shifted.

Because a demagnification of the field stop onto the reticle is provided, the current density of the charged-particle beam at the field stop is smaller than the current density at the reticle. The current density at the reticle is generally adjusted so that electron-electron interactions do not degrade the images projected onto the sensitized substrate. Although the current density at the reticle is the same as in a conventional apparatus, the current density at the field stop is smaller, reducing heating of the field stop. For example, in an apparatus using an electron beam, most of the electron beam is generally transmitted by the reticle; less than about 1% of the beam energy is absorbed and little heat is generated at the reticle. In contrast, the field stop is generally thick and absorbs approximately 50% of the electron beam incident upon it. In a conventional apparatus in which the field stop is magnified, the current density at the field stop is greater than the current density at the reticle, and the field stop edge can be melted by heat generated by the electron beam.

The demagnification from the field stop to the reticle is constant because the numerical aperture of the beam at the sensitized substrate can be readily altered with a zooming action of the first and second condenser lenses.

Because the electromagnetic deflectors satisfy VAL conditions, a principal ray of the charged-particle beam is shifted away the optical axis. Because the charged-particle beam propagates near the axis of the third condenser lens, aberrations produced by the third condenser lens are reduced.

The foregoing and other objects, features, and advantages of the invention will become more apparent from the following detailed description which proceeds with reference to the accompanying drawings.

DETAILED DESCRIPTION

Figure 1:
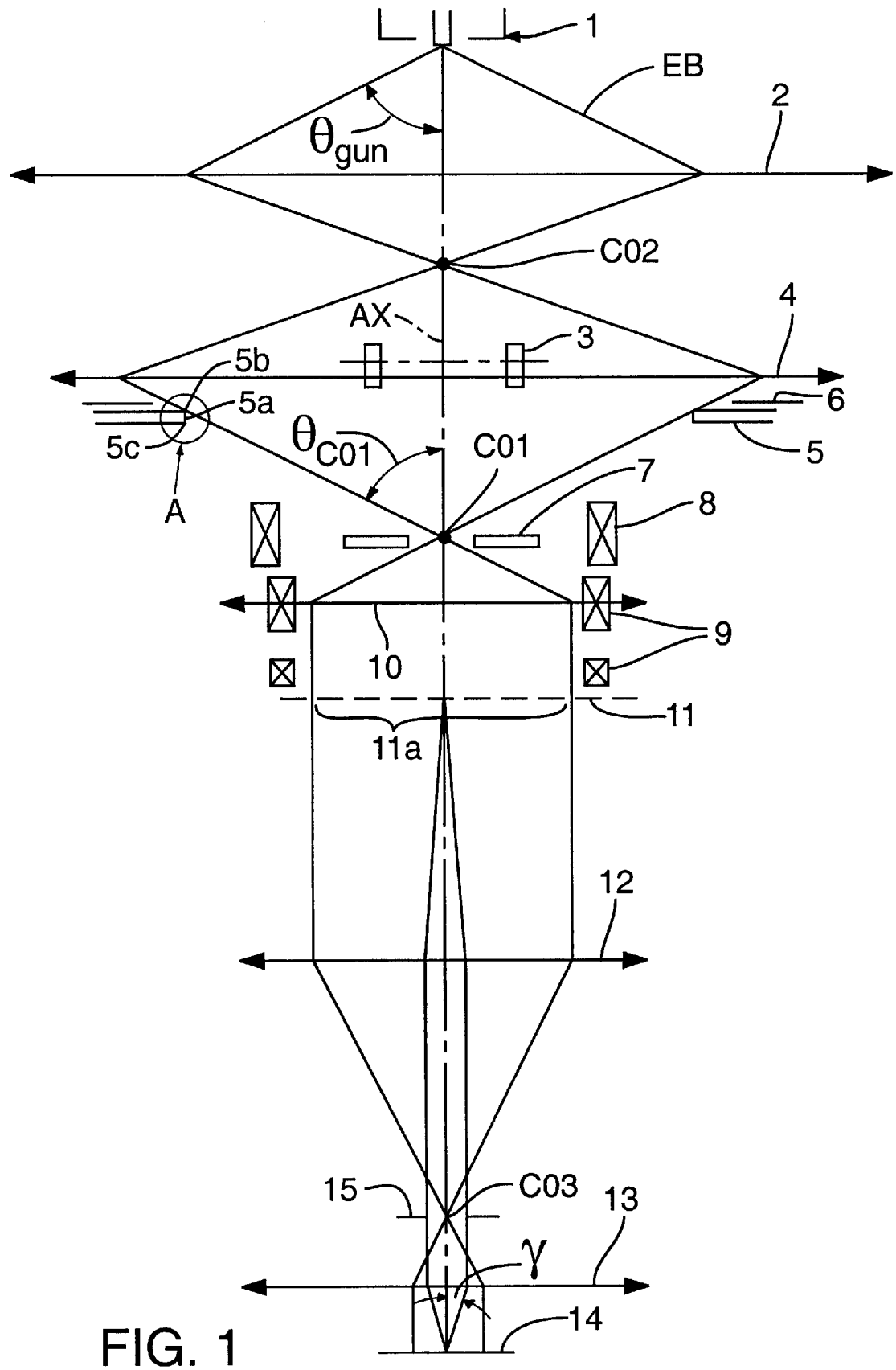
FIG. 1 is a schematic drawing of a charged-particle-beam (CPB) lithography apparatus using an electron beam.

With reference to FIG. 1, an electron-beam lithography apparatus for projecting a demagnified image of a sub-field 11a of a reticle 11 onto a sensitized substrate 14 comprises an electron gun 1 that emits an electron beam EB, condenser lenses 2, 4, and a field stop 5. The electron gun 1 is preferably a LaB$_6$ cathode operating under space-charge limited conditions. The condenser lenses 2, 4 direct the electron beam EB to the field stop 5 and form beam crossovers CO2, CO1, respectively, on an optical axis AX. The condenser lenses 2, 4 are adjusted so that the aperture defined by the field stop 5 is uniformly irradiated.

The aperture of the field stop 5 is rectangular with dimensions twice those of the sub-field. An edge 5a of a cross-section A of the field stop 5 has right-angle corners 5b, 5c. In addition, the edge 5a is untapered.

A heat sink 6 is placed on the electron-gun side ("gun-side") of the field stop 5 to block part of the electron beam EB before the electron beam EB reaches the field stop 5. The heat sink 6 reduces the beam current on the field stop 5 and thereby reduces electron-beam heating of the field stop 5.

Because the aperture of the field stop 5 is twice as large as the sub-field 11a and the image of the field stop 5 is generally projected onto the reticle 11 with a demagnification of one-half, the electron beam current density at the field stop 5 is approximately one-fourth of the current density at the reticle 11. Consequently, even if the edge 5a of the field stop 5 absorbs one-half of the beam current incident on the edge 5a, the edge 5a is not heated enough to melt it. Other factors also reduce temperature rises in the field stop 5. The edge 5a has a larger thermal mass than the edge of conventional field stops and the electron-beam current to the field stop 5 is reduced by the heat sink 6. While the field stop 5 is generally projected onto the reticle 11 with a demagnification of about one-half, temperature increases are reduced at other demagnifications, depending on the demagnification 1/M, where $M \geq 1$.

The apparatus further comprises a blanking deflector 3 and a blanking aperture 7, both placed gun-side of the reticle 11. The blanking aperture 7 is located so that its center coincides with the crossover CO1. In addition, the blanking deflector 3 is gun-side of the field stop 5. When a voltage is applied to the blanking deflector 3, the electron beam EB is deflected toward the blanking aperture 7 and the crossover CO1 is deflected away from the axis AX. If the deflection is sufficiently large, the blanking aperture 7 blocks the electron beam EB completely and the electron beam EB does not reach the reticle 11.

The apparatus further comprises a condenser lens 10 and electromagnetic deflectors 8, 9. The condenser lens 10 collimates the electron beam EB received from the crossover CO1 and irradiates the reticle 11. The deflectors 8, 9 deflect the electron beam EB so that the image of the field stop 5 can be selectively directed to any of various sub-fields. The deflector 8 and the blanking aperture 7 are both placed along the axis AX so that their centers coincide with the crossover CO1.

The apparatus further comprises first and second projection lenses 12, 13. The first projection lens 12 receives the electron beam EB transmitted by the reticle 11 and forms a crossover CO3 in a crossover aperture 15. The second projection lens 13 then directs the electron beam EB to the sensitized substrate 14, forming a demagnified image of the sub-field with a demagnification of 1/M.

Because the condenser lens 4 converges the electron beam into the crossover CO1, the side wall 5a of the field stop 5 is generally not irradiated by the electron beam EB. Therefore, the electron beam EB is not reflected or scattered by the field stop 5 and accidental irradiation of the reticle 11 and associated accidental irradiation of the sensitized substrate 14 are reduced.

Figure 2:
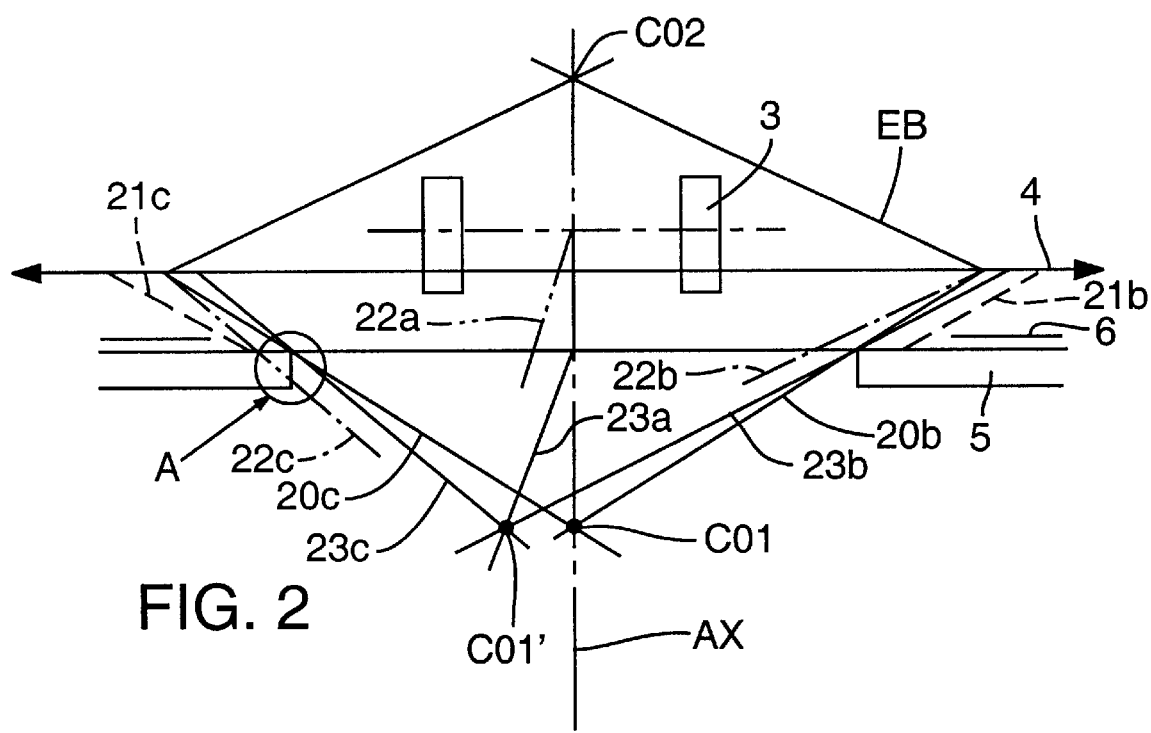
FIG. 2 is an enlarged schematic drawing of a blanking deflector and a field stop as shown in FIG. 1.
Figure 3:
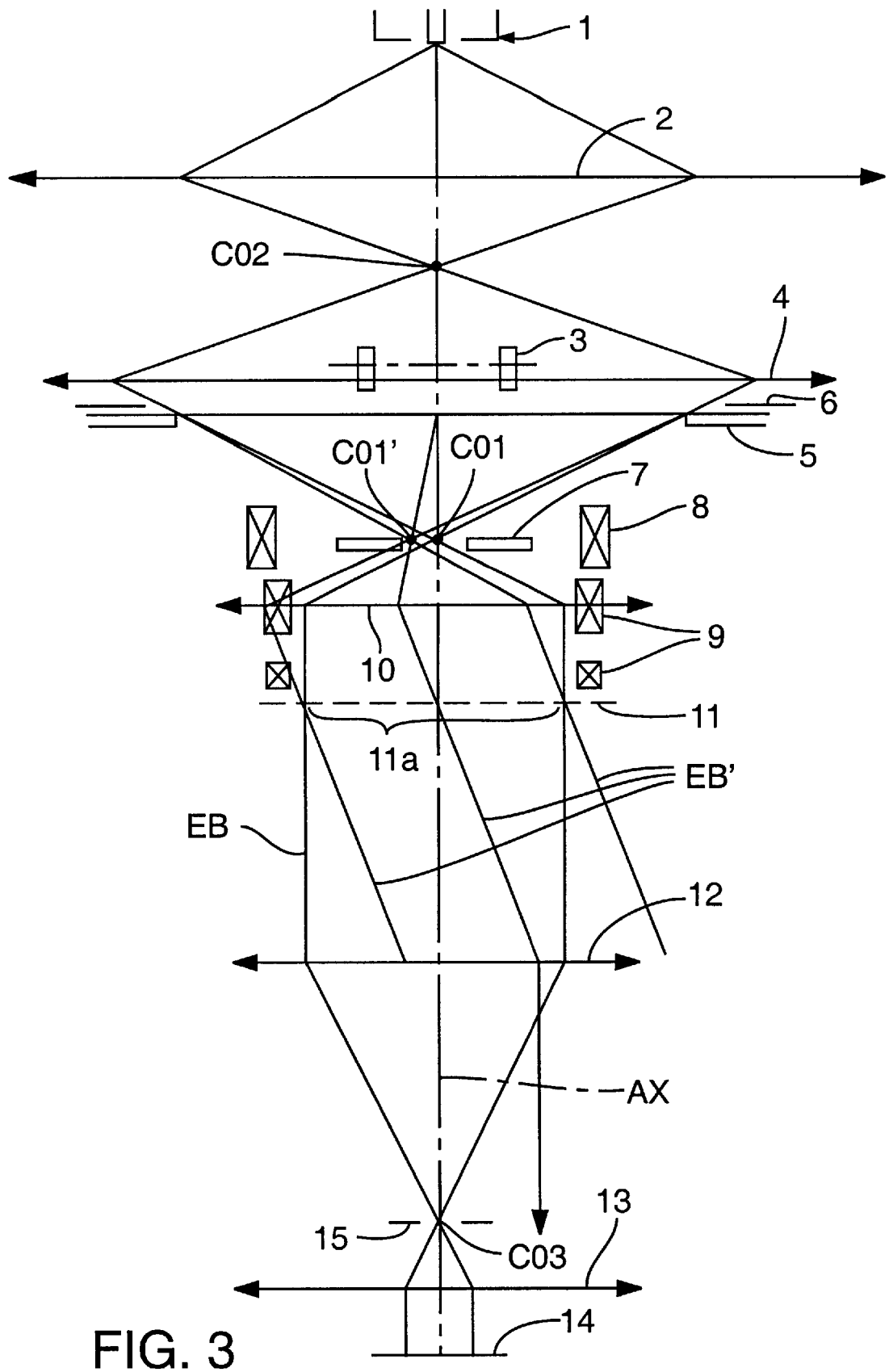
FIG. 3 is a schematic of the CPB lithography apparatus of FIG. 1 illustrating the deflection of the electron beam during a blanking transition.

A deflection of the electron beam EB by the deflector 3 so that the beam EB is not completely blocked by the blanking aperture (a "blanking transition") is explained with reference to FIGS. 2–3. In FIG. 2, a voltage applied to the blanking deflector 3 deflects the crossover CO1 to a crossover location CO1'. Before deflection by the blanking deflector 3, electrons propagating through the perimeter of the aperture of the field stop 5 follow exemplary paths 20b, 20c from the condenser lens 4 to the crossover CO1. The crossover CO1 is on the axis AX. When deflected by the blanking deflector 3, electrons formerly propagating along the paths 20b, 20c and the optical axis AX are deflected to the paths 22b, 22c, 22a, respectively.

Because the blanking deflector 3 is located near the field stop 5 and on the gun-side of the field stop 5, the aperture of the field stop 5 is uniformly irradiated by the electron beam EB even during a blanking transition. As a result, electrons propagating along the paths 23a, 23b, 23c are transmitted by the field stop 5 to the crossover CO1'. With reference to FIG. 3, the condenser lens 10 directs a deflected electron beam EB' to the sub-field 11a. Although the electron beam EB' is deflected, the sub-field 11a continues to be uniformly irradiated. Therefore, during a blanking transition, the sub-field 11a continues to be uniformly irradiated as the beam current to the sub-field 11a decreases.

The magnifications of the crossovers CO1, CO3 are changed by axially displacing the crossover CO2 along the axis AX by a so-called zooming operation of the condenser lenses 2, 4. In such a zooming operation, the focal length of the condenser lens 2 is varied so that the crossover CO2 is displaced along the axis AX. The focal length of the condenser lens 4 is correspondingly varied so that the crossover CO2 is re-imaged into the crossover CO1. The location of the crossover CO1 does not change during zooming. In addition, the numerical aperture $\theta_{gun}$ in which the condenser lens 2 captures electrons from the electron gun 1 varies. As a result, the crossover CO1 is formed with a variable magnification but with a constant numerical aperture $\theta_{CO1}$. The numerical aperture γ of the electron beam EB at the sensitized substrate 14 also changes as the magnification of the crossover CO1 changes. Therefore, the demagnification from the field stop 5 to the reticle 11 can be held constant while the numerical aperture γ changes, and it is unnecessary to change the field stop 5 as must be done in a conventional apparatus.

The projection lenses 12, 13 image the pattern from the sub-field 11a onto the sensitized substrate 14. The projection lens 12 forms the crossover CO3 in the crossover aperture 15. The projection lenses 12, 13 re-image the image of the field stop 5 on the reticle 11 onto the sensitized substrate 14. As the various sub-fields of the reticle 11 are selected for projection, the image of the field stop 5 is not always precisely focused onto the reticle 11. Because the numerical aperture at the reticle is small, generally less than 2 mrad, slight focus errors do not degrade the image of the field stop 5 on the reticle 11.

The deflector 9 and the condenser lens 10 preferably satisfy conditions for a variable axis lens ("VAL"). Such lenses are described in M. A. Sturans et al., *J. Vac. Sci. Technol. B6*, 1995–1998 (1988) and H. G. Pfeiffer et al., *Appl. Phys. Lett.* 39(9), 775–776 (1981). If the axial magnetic field of the condenser lens 10 is B(z), then the deflecting magnetic field Y(r,z) supplied by the deflector 9 is given by Equation (1):

$$Y(r, z) = -\frac{1}{2} R(z) \frac{d B(z)}{dz} \quad (1)$$

where r and z are cylindrical coordinates, z is measured along the axis AX, dB(z)/dz is the first derivative of the axial magnetic field B(z), and R(z) is the r coordinate of the path of a principal ray.

The deflector 8 performs as a pre-deflector in a VAL optical system. The axis of the condenser lens 10 is equivalently shifted so that it is colinear with the path of the electron beam EB. This alignment reduces distortion in the image of the field stop 5 on the reticle 11 even if the condenser lens 10 has a short focal length. Therefore, the overall length and focal length of the condenser lens 10 can be shortened. The distance between the blanking aperture 7 and the reticle 11 can also be reduced by reducing the focal length of the condenser lens 10. In addition, a constant crossover diameter can be maintained at the crossover aperture 15, regardless of the distance of the selected sub-field from the axis AX.

While the example embodiment described above uses an electron beam, other charged-particle beams are applicable. Also it will be apparent that because the field stop 5 is demagnified onto the reticle 11, the dimensions of the field stop need not be as tightly controlled as in a conventional apparatus with a magnification greater than one.

Because the demagnification from the field stop 5 to the reticle 11 is constant when the numerical aperture of the beam changes, it is unnecessary to change the field stop 5 when the numerical aperture changes.

Having illustrated and demonstrated the principles of the invention in a preferred embodiment, it should be apparent to those skilled in the art that the preferred embodiment can be modified in arrangement and detail without departing from such principles. We claim as the invention all that comes within the scope of these claims.

What is claimed is:

1. A charged-particle beam lithography apparatus for projecting an image of a reticle onto a sensitized substrate, comprising:

(a) a charged-particle source that emits a beam of charged-particles along an axis;

(b) a field stop defining an aperture, the field stop receiving the beam from the charged-particle source and shaping the beam to have a cross-section corresponding to the aperture of the field stop;

(c) a blanking deflector located upstream of and near the field stop;

(d) a blanking aperture located downstream of the field stop, the blanking aperture blocking the beam deflected by the blanking deflector whenever a beam deflection imposed by the blanking deflector is sufficiently large;

(e) a first condenser lens located downstream of the field stop, the first condenser lens producing an image of the field stop onto a reticle; and (f) a projection-lens system located downstream of the reticle, the projection-lens system receiving the beam transmitted by the reticle and projecting an image of the reticle onto the sensitized substrate.

2. The apparatus of claim 1, wherein the beam converges at the field stop.

3. The apparatus of claim 1, further comprising a heat sink located near the field stop and between the field stop and the charged-particle source.

4. The apparatus of claim 1, wherein the field stop aperture has an untapered edge.

5. The apparatus of claim 1, further comprising:

a second condenser lens located between the charged-particle source and the blanking deflector; and a third condenser lens located between the second condenser lens and the field stop, the third condenser lens forming a first crossover at the blanking aperture and the second condenser lens forming a second crossover between the second and third condenser lenses, the beam having a numerical aperture at the sensitized substrate that is varied by changing the location of the second crossover between the second and third condenser lenses.

6. The apparatus of claim 1, wherein the projection-lens system comprises:

a first projection lens located downstream of the reticle, the first projection lens receiving the beam transmitted by the reticle;

a crossover aperture located downstream of the first projection lens, wherein the first projection lens forms a crossover at the crossover aperture; and a second projection lens located downstream of the crossover aperture, the second projection lens receiving the beam from the crossover aperture and directing the beam onto the sensitive substrate.

7. The apparatus of claim 1, further comprising:
a first electromagnetic deflector located axially at the blanking aperture; and
a second electromagnetic deflector satisfying variable axis lens (VAL) conditions with respect to the first condenser lens, the image of the field stop projected onto the reticle by the first condenser lens being shifted by adjusting the first and second electromagnetic deflectors synchronously.

8. A charged-particle-beam lithography apparatus for projecting an image of a reticle onto a sensitized substrate, the apparatus comprising in order along an axis:
   (a) a charged-particle source that emits a beam of charged particles along the axis;
   (b) a field stop defining an aperture, the field stop receiving the beam from the charged-particle source and shaping the beam to have a cross-section corresponding to the aperture of the field stop;
   (c) a blanking deflector selectively deflecting the beam whenever a voltage is applied to the blanking deflector;
   (d) a blanking aperture blocking the beam deflected by the blanking deflector;
   (e) a first electromagnetic deflector;
   (f) a condenser lens located downstream of the field stop, the condenser lens producing an image of the field stop onto a reticle situated at a reticle mounting plane;
   (g) a second electromagnetic deflector;
   (h) a projection-lens system located downstream of the reticle, the projection-lens system receiving the beam transmitted by the reticle and projecting an image of the reticle onto the sensitized substrate; and
   (i) the second electromagnetic deflector and the condenser lens satisfying variable axis lens (VAL) conditions, and the image of the field stop on the reticle mounting plane being shifted by adjusting the first and second electromagnetic deflectors.

9. The apparatus of claim 8, wherein the beam converges at the field stop.

10. The apparatus of claim 8, further comprising a heat sink located near the field stop and between the field stop and the charged-particle source.

11. The apparatus of claim 8, wherein the field stop aperture has an untapered edge.

12. A charged-particle beam lithography apparatus for projecting an image of a reticle onto a sensitized substrate, comprising:
   (a) a charged-particle source that emits a beam of charged-particles along an axis;
   (b) a first condenser lens located downstream of the charged-particle source, the first condenser lens forming a first crossover downstream of the first condenser lens;
   (c) a second condenser lens located downstream of the first condenser lens and the first crossover, the second condenser lens forming a second crossover downstream of the second condenser lens;
   (d) a blanking deflector located axially between the charged-particle source and the second crossover, the blanking deflector deflecting the beam from the charged-particle source;
   (e) a field stop located between the charged-particle source and the reticle, the field stop defining an aperture that receives the beam from the charged-particle source and shapes the beam to have a cross-section corresponding to the aperture of the field stop;
   (f) a blanking aperture located axially at the second crossover, the blanking aperture blocking the beam deflected by the blanking deflector whenever a beam deflection imposed by the blanking deflector is sufficiently large;
   (g) a third condenser lens located downstream of the blanking aperture but upstream of a reticle, the third condenser lens producing an image of the field stop onto the reticle; and
   (h) a projection-lens system located downstream of the reticle, the projection-lens system receiving the beam transmitted by the reticle and projecting an image of the reticle onto the sensitized substrate, the beam at the sensitized substrate having a numerical aperture that is varied by changing the axial location of the first crossover between the first and second condenser lenses.

13. The apparatus of claim 12, wherein the beam converges at the field stop.

14. The apparatus of claim 12, further comprising a heat sink located near the field stop and between the field stop and the charged-particle source.

15. The apparatus of claim 12, wherein the field stop aperture has an untapered edge.

16. A charged-particle beam lithography apparatus for projecting an image of a reticle onto a sensitized substrate, comprising:
   (a) a charged-particle source that emits a beam of charged-particles along an axis;
   (b) a field stop defining an aperture, the field stop receiving the beam from the charged-particle source and shaping the beam to have a cross-section corresponding to the aperture of the field stop;
   (c) a blanking deflector located upstream of the reticle, the blanking deflector deflecting the beam from the charged-particle source;
   (d) a blanking aperture located downstream of the field stop, the blanking aperture blocking the beam deflected by the blanking deflector whenever a beam deflection imposed by the blanking deflector is sufficiently large;
   (e) a condenser lens located downstream of the field stop, the condenser lens producing a demagnified image of the field stop onto a reticle; and
   (f) a projection-lens system located downstream of the reticle, the projection-lens system receiving the beam transmitted by the reticle and projecting an image of the reticle onto the sensitized substrate.

17. The apparatus of claim 16, wherein the beam is convergent at the field stop.

18. The apparatus of claim 16, wherein the blanking deflector is located upstream of and near the field stop.

19. The apparatus of claim 16, further comprising a heat sink located near the field stop and between the field stop and the charged-particle source.

20. The apparatus of claim 16, wherein the field stop aperture has an untapered edge.

* * * * *